United States Patent [19]

Bokitch

[11] Patent Number: 5,030,916
[45] Date of Patent: Jul. 9, 1991

[54] AUTO ELECTRIC TESTER

[76] Inventor: Dennis J. Bokitch, 191 Elmview Road, Regina, Saskatchewan, Canada, S4R 6B5

[21] Appl. No.: 544,220

[22] Filed: Jun. 25, 1990

[51] Int. Cl.$^5$ .............................. G01R 31/00
[52] U.S. Cl. ................... 324/503; 324/556; 324/133; 324/72.5
[58] Field of Search ............... 324/503, 556, 555, 133, 324/550, 500, 725, 149

[56] References Cited

U.S. PATENT DOCUMENTS 4,177,420  12/1979  Tripp .................................. 324/503
4,353,026  10/1982  Edwards, Jr. .................... 324/555

FOREIGN PATENT DOCUMENTS 2148787  4/1973  Fed. Rep. of Germany ...... 324/503

Primary Examiner—Kenneth A. Wieder
Assistant Examiner—Robert W. Meuller

[57] ABSTRACT

An auto electric tester has been provided that is simpler in construction, easier to manufacture and can expedite the location of several electrical problems more easily than all known prior art. The tester comprises a casing, circuitry mounted within the casing, four electrical conductors extending from the casing and connected to the circuitry. The circuitry comprises a full-wave bridge rectifier connected to a first two of the conductors, a relay connected across the bridge so that current flowing in two conductors in either direction to the bridge can activate the relay, a first circuit tap made between the bridge and relay extends to a third one of the conductors and includes in series a diode and a load resistor, second and third circuit taps extend in parallel from the first circuit between said diode and said load resistor to the fourth conductor, said second circuit including in series a relay switch operated by said relay and audible indicator, said third circuit including in series a resistance and a visual indicator.

22 Claims, 1 Drawing Sheet

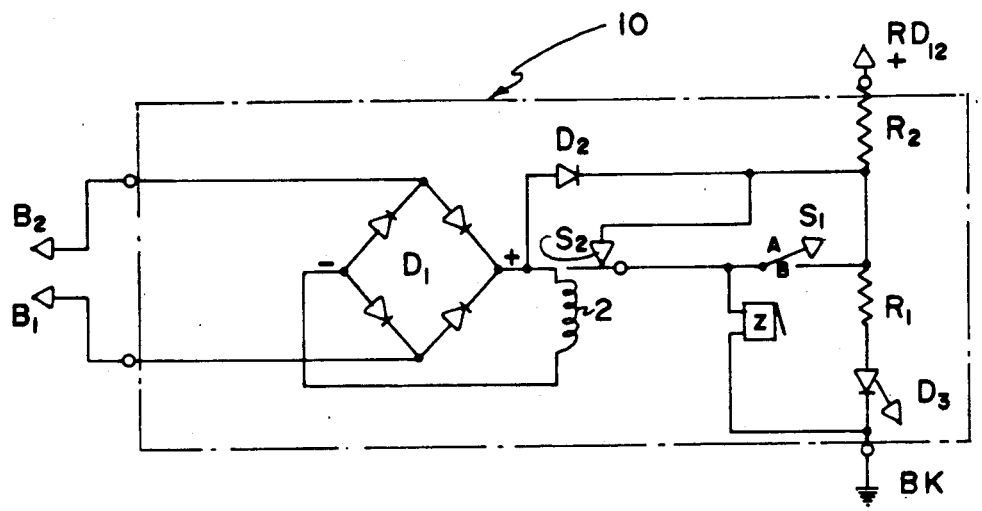
Fig. 1
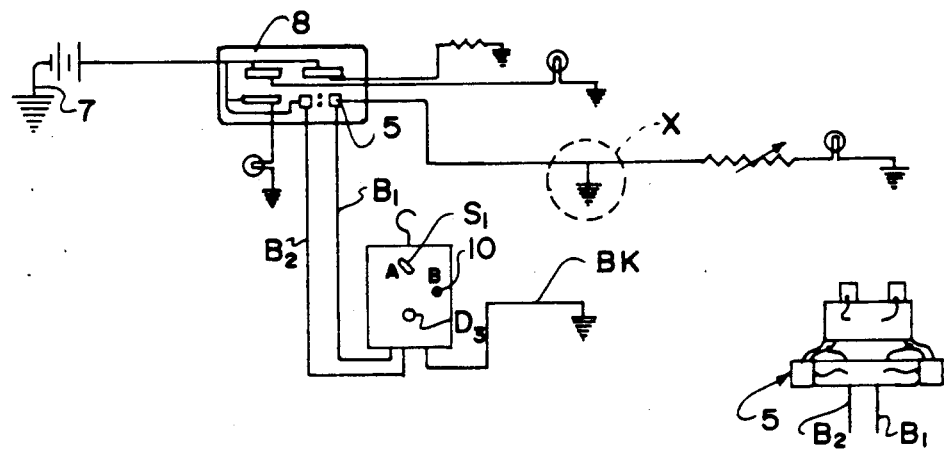
Fig. 2
Fig. 3
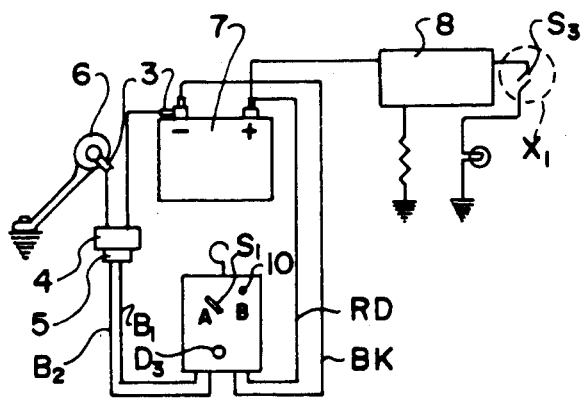
Fig. 4
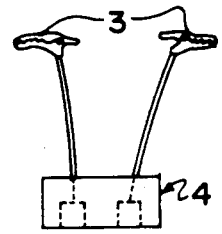
Fig. 5

AUTO ELECTRIC TESTER

FIELD OF INVENTION

This invention relates to electric testers and more particularly to testers for automotive electrical circuits.

BACKGROUND OF THE INVENTION

Ever since the first production of electrical circuitry there was a need to measure at least the voltage or potential and the amperage or current to see that all was functioning. With usage of the circuitry, especially on an automobile, wear and tear takes its toll and problems arise. In an attempt to remove these problems various testers have been marketed such as a volt ohm resistance meter or a live wire lighted probe. While these testers are helpful applicants device can expidite the locating of various problems such as short circuits and unwanted battery load.

While the prior art has revealed several multimeters the only ones even remotely close to applicants device are U.S. Pat. No. 4,791,376 and Canadian Patent 1,263,706. U.S. Pat. No. "376" describes a circuit tester that tests for the presence of voltage and uses a sound or light indicator however, it does not provide these functions by a full-wave rectifier with a relay across the rectifier to allow actuation of a buzzer in the event of non current flow through the relay. Canadian patent "706" is designed for ground fault detection in a system with a D.C. power supply and does have a LED display or sound indicator however, it requires a pulser to generate a pulsating ground fault signal and a magnetic sensor for detecting the location of the ground leakage current. There cannot be located in this patent applicants simple externally powered circuit of a full-wave rectifier with a relay across the rectifier to allow actuation of a buzzer in the event of non current flow through the relay. The above prior art is too complicated, too expensive and will not perform in the manner required by applicant.

SUMMARY OF THE INVENTION

The present invention is mainly used to test auto electric circuits. It can test for a short circuit which blows a fuse, a hidden load that drains the battery, a continuity check using an external battery, a live wire check and others depending on the imagination of the user. The present invention basically comprises a casing, circuitry mounted within the casing, four electrical conductors extending from the casing and connected to the circuitry, the circuitry comprises a full-wave bridge rectifier connected to two of the conductors, a switching relay connected across the bridge so that current flowing in the two conductors in either direction to the bridge can activate the relay, a first circuit tap made between the bridge and the relay input extends to a third one of the conductors and includes in series a diode and a load resister, second and third circuit taps extend from the first circuit in parallel to the fourth conductor, the second circuit including in series a relay switch operated by the relay and a sound indicator operative when there is no current in the relay, and the relay switch being closed, the third circuit including in series a resistance and a light indicator operative upon the presence of voltage at the diode bridge.

It is held that the above summarized invention will when properly applied carry out the following objects.

It is primary object of the above invention to provide a tester that will aid in the location of short circuits.

It is a further object of the present invention to provide a tester that will aid in the location of unwanted battery load.

It is yet another object of the present invention to provide a tester that will give a live wire check for a self powered grounded system.

It is yet another object of the present invention to provide a tester that will in conjunction with an external voltage source provide a continuity check.

It is yet another object of the present invention to provide a tester free of battery problems.

It is still a further object of the instant invention to provide a tester easy to manufacture, low in cost and functionally diverse.

Further objects and a fuller understanding of the instant invention will be had when read in conjunction with the following accompanying drawings wherein like numerals will indicate like elements throughout the several views.

DESCRIPTION OF THE DRAWINGS

FIG. 1 is a detailed circuit diagram of the invention

FIG. 2 is a schematic diagram using the invention to test for a short circuit

FIG. 3 is a fuse block adapter for tester hook up to a fuse block

FIG. 4 is a schematic diagram using the invention to test for unwanted battery load.

FIG. 5 is a fuse adapter used in unwanted battery load test.

DETAILED DESCRIPTION OF THE DRAWINGS

Referring now to FIG. 1 there is shown an auto electric tester 10 having four electrical conductors $B_1$ $B_2$ RD and BK connected to the tester circuitry. The circuitry is composed of a diode full-wave rectifier bridge $D_1$ connected to conductors $B_1$ and $B_2$. Connected across the bridge $D_1$ is a relay 2. Connected between the bridge $D_1$ and relay 2 is a first tapped in circuit to electrical conductor RD containing in series a diode $D_2$ and a 270 $\Omega$ $\frac{1}{2}$W load resistor $R_2$. Tapped into the first circuit between diode $D_2$ and resistor $R_2$ is a second and third circuit in parallel and terminating in electrical conductor BK, the second circuit includes in series a relay switch $S_2$ and a buzzer Z, the third circuit includes in series a 1K $\frac{1}{2}$W resistance and a light emitting diode $D_3$ A jumper with switch $S_1$ is placed across the second and third circuits, "A" position is open while "B" position is closed.

For use of tester 10 for short circuit testing we have in FIG. 2 a battery 7 which is a part of the automobiles electrical system. An electrical conductor from the battery is connected to the fuse block 8 which has several circuits connected thereto for example only. A blown fuse circuit is also included, the fuse being blown by a short circuit or ground fault at X. Tester 10 has conductor leads $B_1$ and $B_2$ shown as connected in series with the blown circuit by fuse block adapter means 5 shown in detail in FIG. 3. An electrical conductor BK from tester 10 is shown as being ground connected to the battery 7.

The detail drawing in FIG. 3 indicates two types of fuses in parallel and connected to conductors $B_1$ and $B_2$. These fuses are blown thus allowing a series connection to tester 10. The two types of fuses provide an easy fuse block hook-up depending on which type the automobile is equipped with. A replaceable type of fuse block adapter means is also envisaged to accommodate any size or shape of fuse mounting.

Now referring to FIG. 4 there is shown a diagram of the tester 10 being used to check for an unwanted battery load at $X_1$ such as the trunk light remaining on due to faulty switch $S_3$. The tester 10 has conductor RD connected to the + post of battery 7 and conductor BK connected to the − post. The + post has a supply conductor feeding fuse block 8 which has two circuits as examples one of which contains $X_1$. The automobile battery 7 has its ground strap 6 removed. The electrical conductors $B_1$ and $B_2$ have connected thereto in series fuse block adapter means 5 and fuse adapter 4 with one alligator clip 3 connected to ground strap 6 and the other alligator clip 3 connected to the − post of battery 7.

The fuse adapter 4 shown in FIG. 5 teaches the use of this adapter to engage fuse block adapter means 5 thereby enabling $B_1$ and $B_2$ to be connected to ground strap 6 and the − post of 7 by alligator clips 3.

Operation

To use applicants invention to test for a short circuit that has caused a blown fuse one looks to the circuit diagram of FIG. 2. The jumper switch is set to the open position A, the fuse block adapter means connected to conductors $B_1$ and $B_2$ replaces the blown fuse in the fuse block and the ground conductor BK is connected to the vehicle chassis. The LED should now be on indicating that you have voltage present at the fuse box, a good connection to the fuse adapter and a good ground connection. The jumper switch can be set to B where both the buzzer and LED should operate. The jumper switch is now returned to position A. If there is a short in this circuit current will flow through the bridge, it will activate the relay, open the relay switch and the buzzer will not operate if the short is removed current will flow through the bridge through the relay switch, since the relay is not activated, and to the buzzer which operates.

In using the invention to test for an unwanted battery load or drain such as a trunk light that stays on when it is supposed to be off, we refer to the diagram as set out in FIG. 4. The jumper switch is set to the open position A. The battery ground cable is removed. The conductor RD is connected to the + post of the battery and the conductor BK is connected to the − post of the battery. The fuse block adapter means attached on the ends of the conductors $B_1$ and $B_2$ has connected thereto a fuse adapter with alligator clips, one of which is clipped onto the battery ground strap and the other of which is clipped onto the battery − post. The LED should now be on if we have good + and − battery post connections. If there is no light, switch jumper switch to B and buzzer should operate. This is only a check for the operability of the LED, the buzzer, and/or the connections at the + and − battery posts. The jumper switch is now switched back to the A or open position. If there is a current drain the relay will be activated, the relay switch will be open and the buzzer will not operate. When the battery drain has been remedied there will be no current in the relay the relay switch will be closed and the buzzer will operate.

While one normally expects a signal when there is a problem, the reverse has been selected to avoid, in the simplest manner, the annoyance of an audible signal while searching for the problem which could take some considerable time. The audible signal has been chosen to avoid the cost of a meter, to simplify construction and to avoid the necessity of eye contact for a light when one is in a difficult position searching for the problem.

The tester has other uses limited only by ones imagination. The tester may be used in conjunction with the vehicle battery as a continuity tester using the conductors RD, BK and the LED. A further use may be as a live wire tester on the vehicle using the RD, BK and the LED. With the BK conductor connected to the chassis, a probe or clip on the RD conductor contacting a live wire will cause the LED to light or the audible signal to operate if the jumper switch is closed.

Although the invention has been described with a certain degree of particularity it is understood that the present disclosure of the preferred form has been made by way of example only and that numerous changes in details of construction and the combination and arrangement of parts may be resorted to without departing from the spirit and scope of the invention as hereinafter claimed.

I claim:

1. An auto electric tester comprising, a casing, circuitry mounted within the casing, four electrical conductors extending from the casing and connected to said circuitry, said circuitry comprising a full-wave bridge rectifier connected to a first two of the conductors, a relay connected across the bridge so that current flowing in the two conductors in either direction to the bridge will activate the relay, a first circuit tap made between the bridge and the relay extends to a third one of the conductors and includes in series a diode and a load resistor, second and third circuit taps extend in parallel from the first circuit between said diode and said load resistor to the fourth conductor, said second circuit including in series a relay switch operated by said relay and an audible indicator, said third circuit including in series a resistance and a visual indicator.

2. An auto electric tester as claimed in claim 1 further including a two position manual switch mounted on the exterior of the casing which can either connect or disconnect a jumper between the second and third circuits.

3. An auto electric tester as claimed in claim 2 wherein the jumper is located in the second circuit between said relay switch and said audible indicator and in the third circuit prior to said visual indicator and said resistance.

4. A short circuit tester for use on a vehicle electrical chassis ground return system powered by a battery and having a connected fuse block with fuse mountings and a blown fuse circuit connected to said fuse block, comprising, a casing, circuitry mounted in said casing and comprising, diode bridge means for connecting across said blown fuse mounting, relay means connected across said diode bridge means, a first circuit means from the relay means input to ground including a relay contact switch and a no fault indicator in series, whereby a short circuit allowing current to pass through the bridge and relay, opens the relay contact switch preventing operation of the indicator thus indicating a faulty circuit, while removal of the fault allows current flow only in said diode bridge means and said first circuit means thereby operating the indicator.

5. A short circuit tester as claimed in claim 4 further including a fuse block adapter means for connecting said diode bridge means to the blown fuse mounting.

6. A short circuit tester as claimed in claim 4 wherein the no fault indicator is in the form of a buzzer.

7. A short circuit tester as claimed in claim 6 further including an indicator light in parallel with said first circuit means whereby fuse block voltage presence and good ground connection can be indicated.

8. A short circuit tester as claimed in claim 7, further including a fuse block adapter means for connecting said diode bridge means to the blown fuse mounting and wherein the diode bridge means is a full-wave rectifier type.

9. A short circuit tester as claimed in claim 4 further including a light emitting diode circuit in parallel with said first circuit means whereby fuse block voltage presence and good ground connection can be indicated.

10. A battery tester for use on a vehicle electrical system powered by a battery with a ground terminal and a power terminal having a vehicle chassis ground return system and powering a fuse block feeding multiple circuits comprising a casing, circuitry mounted within the casing, four electrical conductors extending from the casing and connected to said circuitry said circuitry comprising a full-wave bridge rectifier connected to a first two of the conductors, a relay means connected across the bridge rectifier so that current flowing in the two conductors in either direction to the bridge can activate the relay, a first circuit tap made between said bridge and said relay means extends to a third one of the conductors and includes in series a diode and a load resistor, a second circuit tap between said diode and said load resistor extends to the fourth one of said conductors and includes in series a relay switch operated by said relay means and an audible indicator, means connecting said first two conductors across the vehicle chassis ground return and the ground terminal of said battery which is disconnected, means to connect said third conductor to the power terminal of said battery feeding the fuse block and means to connect said fourth conductor to said ungrounded ground terminal of said battery whereby an undesirable load on the battery passes through the rectifier bridge, through the relay opening the relay switch and preventing operation of the audible indicator, and whereby removal of the undesirable load permits a current from the battery to pass through the relay switch operating the audible indicator.

11. A current flow tester comprising a casing, circuitry within said casing comprising a diode rectifier bridge means connected across two external conductors, a relay means connected across said diode bridge, a first circuit tap between said diode bridge means and said relay means extends to a third external conductor and includes in series a diode and a load resistor, a second circuit tap between said diode and said load resistor includes in series a relay switch, operable by said relay means, and an audible indicator, and extends to a fourth external conductor whereby zero current flow in the diode bridge will result in an audible signal if the third and fourth external conductors have electrical potential applied thereto.

12. A current flow tester as claimed in claim 11 further including a third circuit in parallel with said second circuit and including a visual indicator.

13. A current flow tester as claimed in claim 12 further including electrical contact means mounted on each one of the four external conductors.

14. A current flow tester as claimed in claim 12 wherein the audible signal is a buzzer and the visual indicator is a light emitting diode.

15. A current flow tester as claimed in claim 12 further including a jumper switch connected to the second circuit between the relay switch and the audible indicator and connected to the third circuit ahead of the visual indicator.

16. A current flow tester as claimed in claim 11 further including a fuse block adapter means and a fuse adapter in series connected across the two external conductors.

17. In an undesirable current drain fault finding tester an undesirable current drain receiving means connectable in series with the current drain, series connected switch and indicating means, said switch being responsive to current or absence thereof in said drain current receiving means, said indicating means being activated by current through said switch when in the closed position.

18. The current drain tester as claimed in claim 17 wherein said indicating means current is received from said current receiving means when said switch is closed.

19. The current drain tester as claimed in claim 18 wherein said current receiving means is a full-wave diode rectifier bridge with relay means connected thereacross.

20. The current drain tester as claimed in claim 20 wherein said current receiving means is a full-wave diode rectifier bridge with relay means connected thereacross.

21. The current drain tester as claimed in claim 17 wherein said indicating means current is received from an external source when said switch is closed. rectifier bridge with relay means connected thereacross.

22. A method of testing for a short circuit in a fuse blown circuit of a battery powered fuse block with ground return circuit system comprising providing a tester having a full-wave diode rectifier bridge, a relay means across said bridge, a relay switch actuatable by said relay means in series with a signal means tapped in between said bridge and said relay means and connected to the ground return, removing the blown fuse and connecting said bridge across the blown fuse mounting whereby a current flowing in the fuse blown circuit will not actuate the signal, indicating a short circuit.

* * * * *